United States Patent
Smith et al.

(10) Patent No.: US 7,695,287 B2
(45) Date of Patent: Apr. 13, 2010

(54) BALL GRID ARRAY (BGA) CONNECTION SYSTEM AND RELATED METHOD AND BALL SOCKET

(75) Inventors: Steven C. Smith, Viera, FL (US); Steven R. Snyder, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 885 days.

(21) Appl. No.: 11/428,902

(22) Filed: Jul. 6, 2006

(65) Prior Publication Data

US 2008/0007608 A1    Jan. 10, 2008

(51) Int. Cl.
*H01R 9/09* (2006.01)

(52) U.S. Cl. .............................. 439/70; 439/71; 439/81; 439/83; 439/857

(58) Field of Classification Search ................... 439/70, 439/71, 81, 83, 857, 856, 860
See application file for complete search history.

(56) References Cited

U.S. PATENT DOCUMENTS

| | | | | |
|---|---|---|---|---|
| 5,669,774 A | | 9/1997 | Grabbe | 439/70 |
| 5,702,255 A | * | 12/1997 | Murphy et al. | 439/71 |
| 5,859,538 A | | 1/1999 | Self | 324/755 |
| 5,950,072 A | | 9/1999 | Queyssac | 438/118 |
| 5,984,694 A | * | 11/1999 | Sinclair | 439/70 |
| 6,045,416 A | * | 4/2000 | Sinclair | 439/857 |
| 6,069,481 A | | 5/2000 | Matsumura | 324/755 |
| 6,121,063 A | | 9/2000 | Liu et al. | 438/15 |
| 6,142,792 A | * | 11/2000 | Yang | 439/70 |
| 6,155,845 A | * | 12/2000 | Lin et al. | 439/83 |
| 6,352,437 B1 | * | 3/2002 | Tate | 439/83 |
| 6,368,137 B1 | | 4/2002 | Orwoll | 439/331 |
| 6,501,665 B1 | * | 12/2002 | Ted | 361/808 |
| 6,783,375 B2 | * | 8/2004 | He | 439/83 |
| 6,843,662 B2 | * | 1/2005 | Ju | 439/83 |
| 6,873,168 B2 | | 3/2005 | Kazama | 324/754 |
| 6,875,025 B2 | | 4/2005 | Hsu et al. | 439/71 |
| 6,955,545 B1 | * | 10/2005 | Morana et al. | 439/83 |
| 7,001,190 B2 | * | 2/2006 | Morana et al. | 439/81 |
| 7,009,413 B1 | | 3/2006 | Alghouli | 324/755 |
| 7,021,944 B2 | * | 4/2006 | Adachi et al. | 439/71 |
| 7,029,292 B2 | * | 4/2006 | Grabbe | 439/83 |
| 7,442,045 B1 | * | 10/2008 | Di Stefano | 439/66 |
| 2003/0114029 A1 | * | 6/2003 | Lee et al. | 439/83 |
| 2005/0009385 A1 | * | 1/2005 | Korsunsky et al. | 439/83 |
| 2005/0020117 A1 | | 1/2005 | Motohashi | 439/331 |
| 2005/0070131 A1 | | 3/2005 | McLenaghan | 439/70 |
| 2005/0239304 A1 | * | 10/2005 | Morana et al. | 439/83 |

FOREIGN PATENT DOCUMENTS

| | | |
|---|---|---|
| JP | 11135217 | 5/1999 |
| JP | 2001/305182 | 10/2001 |

* cited by examiner

*Primary Examiner*—Gary F. Paumen
(74) *Attorney, Agent, or Firm*—Allen, Dyer, Doppelt, Milbrath & Gilchrist, P.A.

(57) ABSTRACT

A ball grid array (BGA) connection system includes an integrated circuit (IC) package that includes a plurality of conductive balls forming a ball grid array (BGA) arranged in a matrix pattern. A printed circuit board (PCB) includes a plurality of ball sockets arranged in a corresponding matrix pattern. Each ball socket includes a base having one side that engages the PCB and an opposing side configured for seating a conductive ball of the BGA. A plurality of prongs are secured to and extend from the base and configured to receive and hold a conductive ball into contact with the base.

21 Claims, 3 Drawing Sheets

BALL GRID ARRAY (BGA) CONNECTION SYSTEM AND RELATED METHOD AND BALL SOCKET

FIELD OF THE INVENTION

The present invention relates to the field of integrated circuit (IC) packages, and more particularly, to ball grid array (BGA) IC packages and related connection systems.

BACKGROUND OF THE INVENTION

A ball grid array (BGA) is related to a pin grid array (PGA), in which an integrated circuit (IC) package includes face covered or partly covered with pins in a PGA or balls in a BGA, usually in a grid or matrix pattern. The pins and balls conduct electrical signals from the IC positioned in the IC package to a printed circuit board (PCB) e.g., a printed wiring board, on which the package is placed. In a BGA, the balls are conductive balls, typically formed from solder and positioned at the bottom of the IC package. Usually the PCB carries copper pads in a matrix pattern that matches the matrix pattern formed by the conductive balls. In some manufacturing techniques, the assembly is heated in a reflow oven or infrared heater, causing the conductive balls to stick to the PCB. Usually, the composition of the solder alloy and soldering temperature are chosen such that the solder does not completely melt, but stays semi-liquid, allowing each conductive ball to stay separate from its neighbors.

A BGA IC package usually has a lower thermal resistance between the IC package the PCB such that any heat generated by the IC flows more easily to the PCB, preventing the IC chip from overheating. Also, because the conductive balls of a BGA are shorter than pins of a PGA as an electrical conductor, the balls have lower inductance than the pins and prevent unwanted distortion of signals in high-speed electronic circuits. One disadvantage of a BGA, however, is that the conductive balls often cannot flex in the manner of pins in a PGA. Any bending and thermal expansion within the PCB is transmitted directly to the BGA IC package, causing solder joints to fracture under high thermal or mechanical stresses. In some designs, this is overcome by matching the coefficient of thermal expansion (CTE) between the PCB and IC package, but even then, it is difficult to inspect for soldering failure once the IC package is secured to a PCB.

As a result, a BGA package has limited inspectability, reworkability and testability and has reliability issues and design limitations when the CTE mismatch between the IC package and the PCB is large. There are a number of proposals with different BGA products, but these products increase the package footprint, height, weight and assembly steps more than desired.

SUMMARY OF THE INVENTION

A ball grid array (BGA) connection system includes an integrated circuit (IC) package that includes a plurality of conductive balls forming a ball grid array (BGA) arranged in a matrix pattern of conductive contacts. A printed circuit hoard (PCB) includes a plurality of ball sockets arranged in a corresponding matrix pattern on the PCB. In one non-limiting example, each ball socket includes a base having one side that engages the PCB and an opposing side configured for seating a conductive ball of a BGA. A plurality of prongs are secured to and extend from the base and are configured to cooperate together and receive and hold a conductive ball into contact with the base.

Each prong of a ball socket includes a ball engaging section configured in a substantially spherical arc and sized to engage a maximum surface area of the conductive ball. Each ball socket includes an indentation formed on the base as a "dimple" in one non-limiting example, which seats a conductive ball on one side. On the opposing side, the configuration of the "dimple" aids to wick solder and compensate for board warpage. Each ball socket can be formed as a microelectroformed member.

In yet another aspect, each prong includes an end having an outwardly extending tab that aids in guiding a conductive ball downward toward the base and into locking relationship with the ball socket. The prongs of each ball socket can be a height greater than the width of the base to aid in imparting flexibility and accommodating thermal mismatch between the PCB and IC package. The prongs can be formed as substantially rectangular leg members that extend outward from the base.

In yet another aspect, a method is set forth that mounts an integrated circuit (IC) package on a printed circuit board (PCB). A plurality of conductive balls form a ball grid array (BGA) that are arranged in a matrix pattern on one of the IC package or PCB and are interconnected with a respective plurality of ball sockets arranged in a corresponding matrix pattern on the respective other PCB or IC package not having the BGA thereon. Each ball socket includes a base having a side that engages the respective IC package or PCB and an opposing side configured for seating a conductive ball. A plurality of prongs are secured to and extend from the base and configured to receive and hold the conductive ball into contact with the base. The IC package, PCB, conductive balls and ball sockets as an assembly can be connected together, for example, reflow soldered together in one non-limiting aspect of the invention.

A ball socket is also set forth in detail.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art. Like numbers refer to like elements throughout.

Figure 1:
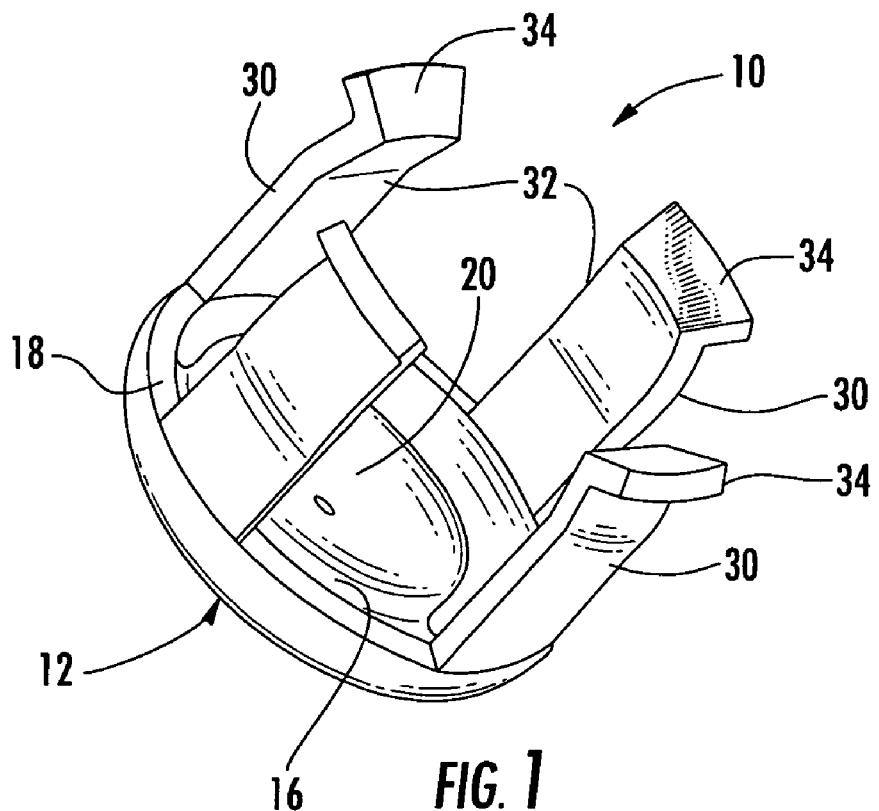
FIG. 1 is an isometric view of a hall socket in accordance with a non-limiting example of the present invention and looking inward toward the indentation that seats a ball and showing the prongs extending outward from the base.
Figure 2:
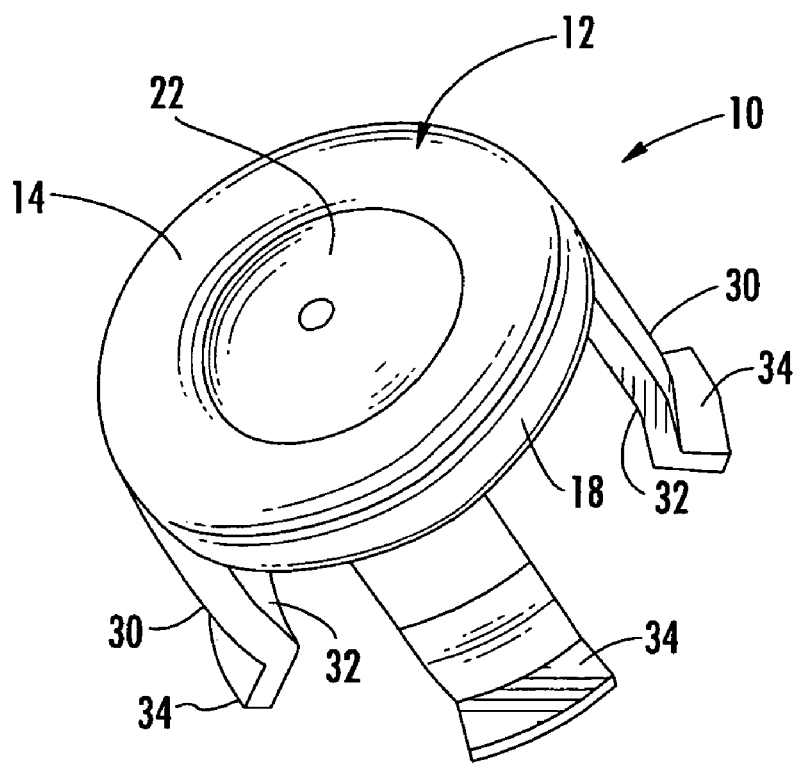
FIG. 2 is another isometric view of the ball socket looking in a reverse direction from that shown in FIG. 1 and showing the side of the base that engages a PCB or similar surface.

In accordance with a non-limiting example of the present invention, FIGS. 1 and 2 are isometric views of the ball socket 10 that can be arranged in a matrix pattern on a surface, such as a PCB, to receive balls of a BGA that are also arranged in a matrix pattern and form a ball grid array (BGA), which is positioned either on an integrated circuit (IC) package or other semiconductor device or applied on a PCB in a reverse configuration.

The ball socket 10, in accordance with non-limiting examples, facilitates solder joint inspection, rework and troubleshooting by forming a socketed BGA system that can be temporarily or permanently locked together. Temperature and moisture sensitive BGA IC packages can avoid solder reflow temperatures and limits on the allowable number of total reflows. The system can be tolerant of variations in PCB flatness and can be used in pick and place machine compatible systems. The use of the ball socket as illustrated does not increase the footprint of the BGA IC package in a manner similar to traditional ball sockets. The coefficient of thermal expansion (CTE) for different materials could be mismatched and the ball socket and BGA connection system can be compliant based on material thickness, temper and prong geometry. The configuration of the ball socket as illustrated substantially eliminates the need for any BGA solder or similar material underfill and allows large quantities of ball grid arrays (BGA's) on a single PCB, such as a printed wiring board or similar structure.

The connection system as described allows greater cost savings, quality and reduced design constraints because of directly verifiable solder connections that reduce labor during electrical testing. Directly verifiable solder connections also provide a greater degree of quality assurance because x-rays are often used to infer connections. Technician labor is also reduced because the traditionally slow (manual) BGA rework procedures are minimized. CTE compliance can provide greater reliability of BGA connections and potentially allow a greater variety of BGA substrates by permitting a greater CTE mismatch, for example, ceramic modules on FR-4 boards. The BGA package count can be unlimited.

FIGS. 1 and 2 show the ball socket 10 that connects a solder or other conductive ball of a BGA. The ball socket 10 includes a base 12 that is substantially circular configured and has an "outer" side 14 (FIG. 2) configured for engaging a PCB and an "interior" or opposing side 16 (FIG. 1) configured for seating a conductive ball from the BGA. As illustrated, a rim 18 is formed on the outer edge of the base 12, and the central portion of the base includes an indentation 20 forming a "dimple," which on the interior side 16 facing the ball acts to seat and center the conductive ball on that side. The other or "outer" side 14 forms an inward "dimple" as an indentation 22 that aids in wicking solder on that outer side 14 to compensate for board warpage. For example, if a large plurality of ball sockets 10 are arranged in a matrix pattern on a PCB, which is warped, the solder can wick within any "dimpled" indentations 22 and fill in different amounts of space created by the board warpage and compensate for board warpage. A thicker solder layer could be wicked, e.g., extend between the ball socket 10 and PCB such that the solder travels and fills the gap created by board warpage.

As illustrated, a plurality of prongs 30 are secured to and extend upward from the base 12 and are configured to receive and hold, such as by snap locking, a conductive ball into contact with the base, and more particularly in the area of the base formed by the indentation 20 forming the central "dimple." Four prongs 30 are illustrated and positioned at the respective 90, 180, 270 and 360 degree positions around the rim 18 and are formed in this non-limiting example as substantially rectangular leg members that extend outward and upward from the base 12 parallel to each other. Each prong 30 includes a ball engaging section 32 that is configured in a substantially spherical arc and sized to engage a maximum surface area of the conductive ball. Each prong 30 also includes an end having an outwardly extending tab 34 that aids in guiding a conductive ball downward toward the base 12 into locking relationship with the ball socket 10. In the examples shown in FIGS. 1 and 2, the ball sockets 10 are illustrated as being substantially similar in height to the width of the base, e.g., in some examples about 20 to about 30 mils in height and about 20 to about 30 mils diameter at the base 12. In other examples, however, the prongs 30 could be formed with a height greater than the width of the base to aid in imparting flexibility and accommodating thermal mismatch between the PCB and IC package.

In operation, the conductive ball seats at the indentation 20 forming the "dimple" at the base 12 and engages the prongs 30 for maximum contact area and electrical/thermal conductivity. The particular configuration of the base 12 provides a flat stable reference surface and a suitable solder fillet as shown by the indentation 22 or "dimple" in FIG. 2. The material thickness, temper and ball socket geometry can be optimized for CTE mismatch mitigation and mate/demate force. The prong tabs 34 facilitate ball insertion by guiding a ball downward along the surface 32 and into a seating relationship with the indentation 20 where the ball is centered. The solder volume on the base 12 can be pretinned to control the amount of wicking the ball socket will experience. Other wicking control mechanisms are possible, for example, by using a coating or selective plating on the ball socket.

One way to form the ball socket is through progressive die stamping or specialized microelectroforming techniques that are suitable for smaller ball size and pitch typical of chip scale packages (CSP) or flip chip components. Such manufacturing techniques are implemented by companies such as Nicoform of Rochester, N.Y., often known for its microelectroforming capabilities. Also, metal MEMs techniques such as taught by HT Microanalytical, Inc. are possible. For example, a multilayer process can be used such as known commercially by HT Precision Fabrication (HTPF) as a lithographic based set of processes that fabricate precise structures. It is a LIGA-like process and provides more flexibility.

Microelectroforming can create replicas of different shapes and textures and uses electroplating technology, for example, depositing a thick metal layer onto an original to be replicated. That part forms an electroform and is operative by electroforming on an atomic scale process. Nickel can be used as a primary material instead of copper. It is also possible to use an electro-deposited nickel-cobalt alloy known as NiColoy. Also, beryllium copper and other types of spring temper formable materials can be used, including phosphor bronze. Other types of nickel hybrids can be used as materials suitable for the ball socket.

Figure 3:
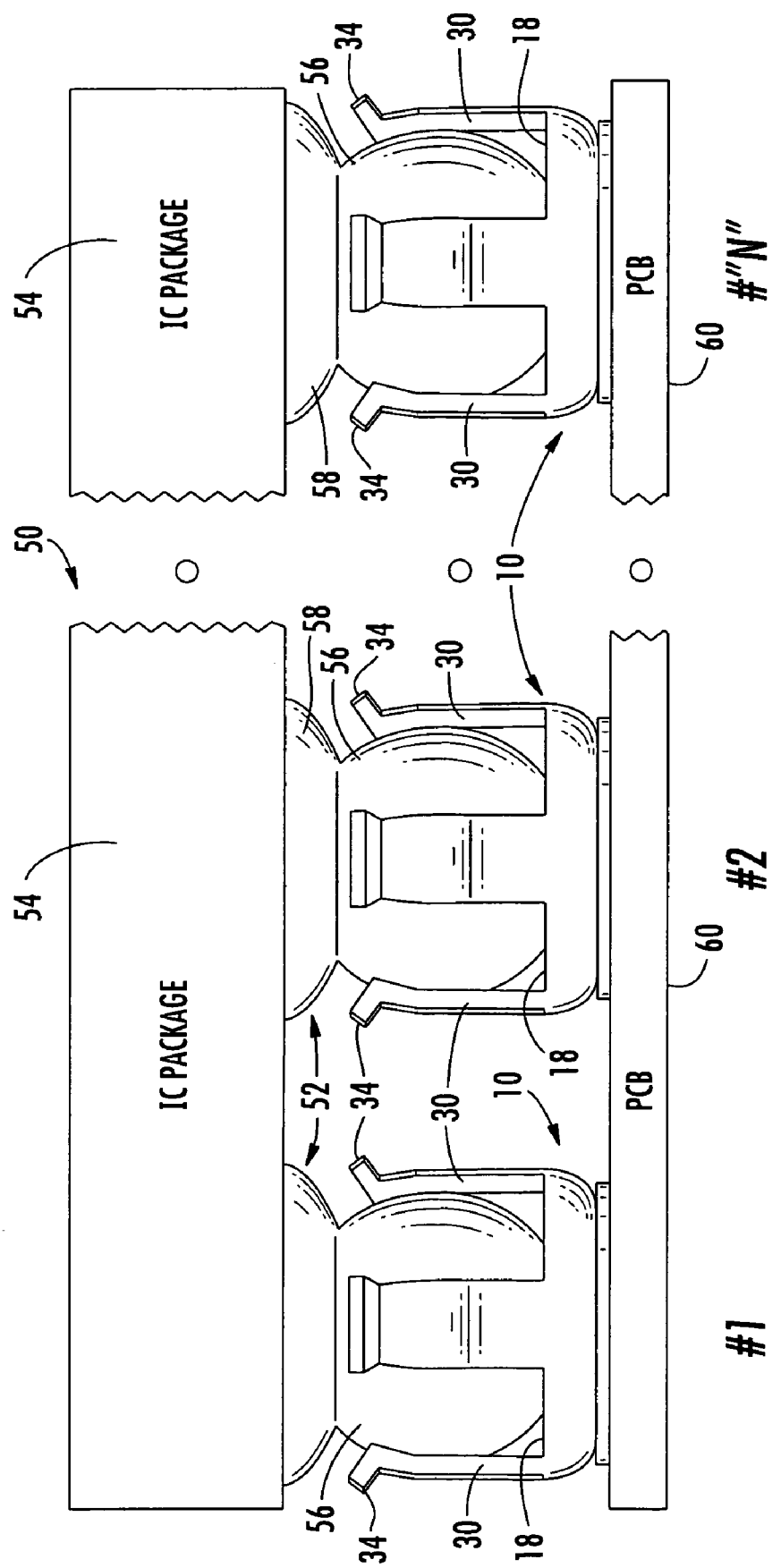
FIG. 3 is a fragmentary, sectional view of a BGA IC package and a PCB having ball sockets that receive the balls from the BGA IC package.
Figure 4:
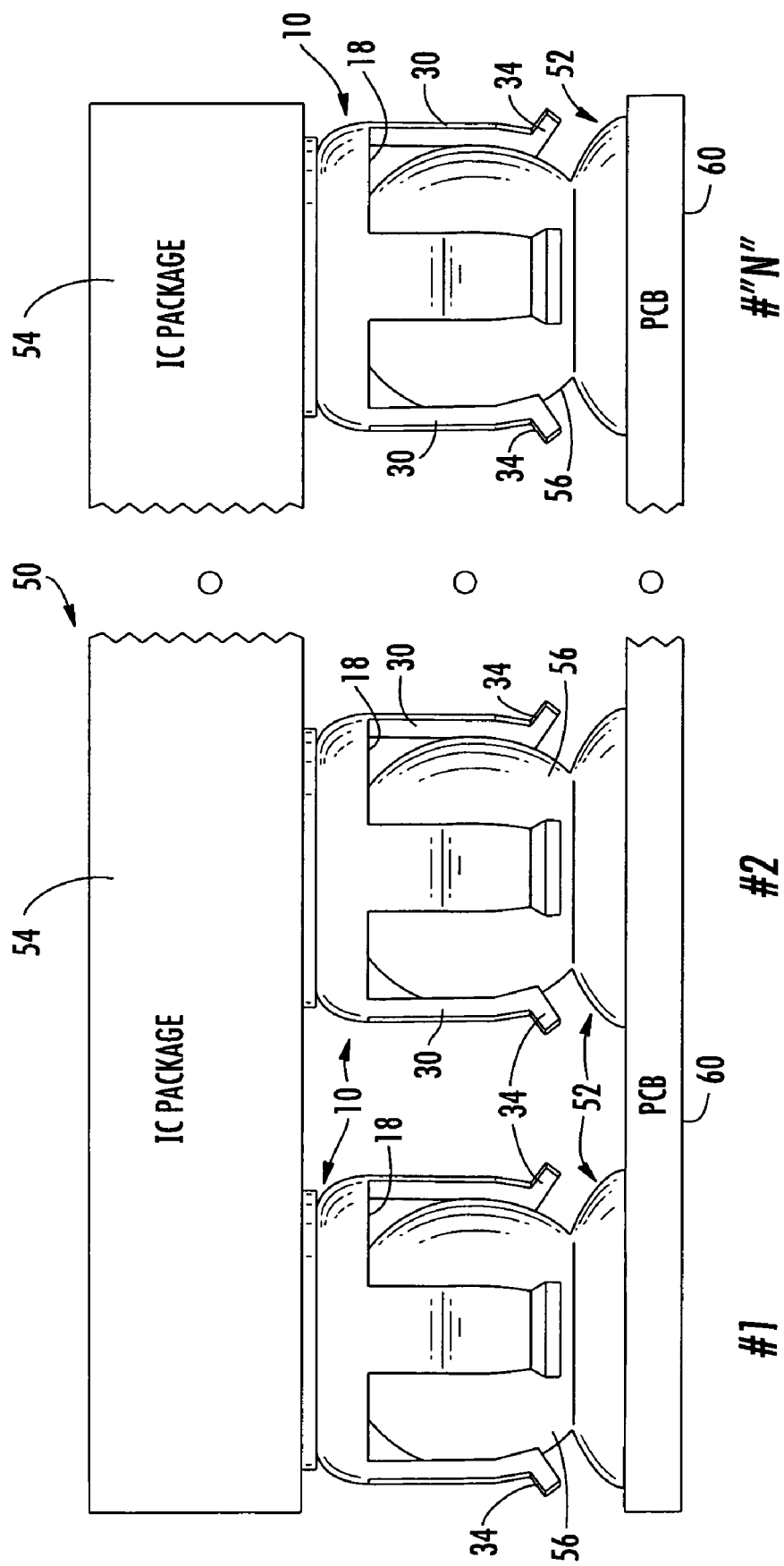
FIG. 4 is another fragmentary, sectional view similar to FIG. 3, but showing the positioning of the balls forming the BGA and the ball sockets reversed, such that the ball sockets are secured onto the bottom of the IC package and the balls forming the BGA are secured on the PCB.

FIGS. 3 and 4 show a ball grid array (BGA) connection system 50 and associated method in which, as shown in FIG. 3, a BGA 52 can be formed on an IC package 54 by a matrix of conductive balls 56. Each conductive ball 56 could be formed as a solder ball that is attached by a retainer member 58 as illustrated, which can be formed by differing techniques known to those skilled in the art. An "n" number of balls form the BGA in a matrix pattern as illustrated. The ball sockets 10 can be secured, such as by reflow soldering, onto the PCB 60 as illustrated and the IC package 54 snap-fitted or locked into engagement with the ball sockets 10. Alternatively, a ball socket 10 could be inserted first onto each ball 56. The entire assembly is placed on a PCB 60 and reflow soldered. FIG. 3 shows one type of BGA connection system in which the ball sockets 10 receive BGA balls 56 of an IC package. The BGA is picked and placed and then reflow soldered to the PCB in one non-limiting example. The BGA could be left as is or temporarily removed for socket inspection, rework and test.

It is also possible to use a socket carrier tool (not shown), which is formed as an identically balled pick and place carrier tool, and CTE matched with the PCB. It could have ball sockets mounted therein, or formed as a perforated carrier, such as FR-4, which could have ball sockets inserted into perforations, with the base of the ball socket protruding therefrom. Once the ball sockets have been reflow soldered to the PCB, the carrier can be removed, leaving ball sockets on the PCB. The BGA can be directly socketed to the PCB. Socket/ball coplanarity can be maintained on a warped PWB by solder paste volume control on the base and forming a pad, and the application of solder to the underside of the socket base. Usually the BGA/carrier requires that the ball melting point exceeds that of the highest possible reflow temperature.

FIG. 4 shows another embodiment in which the BGA 52 is secured onto the PCB 60 and the ball sockets 10 are secured onto the IC package 54. This embodiment shows a reverse configuration, as compared to the configuration shown in FIG. 3. The ball socket 10 and BGA 52 structure could be the same, however.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for mounting an integrated circuit (IC) package on a printed circuit board (PCB), which comprises:
providing a plurality of conductive balls forming a ball grid array (BOA) that are arranged in a matrix pattern on one of the IC package or PCB and a respective plurality of ball sockets arranged in a corresponding matrix pattern on the respective other PCB or IC package not having the BGA thereon, each ball socket comprising a base having a circular edge and an outer side that engages a respective IC package or PCB and an opposing inner side configured for seating a conductive ball, and including a plurality of prongs secured to and extending from the inner side of the base and configured to receive and hold the conductive ball into contact with the inner side of the base and a rim formed on the circular edge and configured to form an indentation on the base of each ball socket that seats the ball on the inner side and wherein the rim engages a surface of the PCB or IC package and said rim and indentation provide a solder fillet to aid in wicking solder and compensate for board warpage; and
interconnecting together the IC package, PCB, conductive balls and ball sockets as an assembly.

2. The method according to claim 1, which further comprises forming the prongs of each ball socket to include a ball engaging section configured in a substantially spherical arc and sized to engage a maximum surface area of the conductive ball.

3. The method according to claim 1, which further comprises forming the ball socket using microelectroforming techniques.

4. The method according to claim 1, which further comprises inserting the ball sockets into a carrier tool before securing the ball sockets onto a PGA or IC package.

5. The method according to claim 1, which further comprises forming the BGA on the IC package.

6. The method according to claim 1, which further comprises securing ball sockets onto the PCB and mounting the IC package to the PCB by inserting the conductive balls forming the BGA on the IC package into respective ball sockets.

7. The method according to claim 1, which further comprises connecting the ball sockets onto respective conductive balls before securing the ball sockets onto the PCB.

8. The method according to claim 1, which further comprises forming the BGA on the PCB.

9. The method according to claim 1, which further comprises matching the coefficient of thermal expansion (CTE) of the PCB and IC package.

10. A ball grid array (BOA) connection system comprising:
an integrated circuit (IC) package that includes a plurality of conductive balls forming a ball grid array (BOA) arranged in a matrix pattern of conductive contacts;
a printed circuit board (PCB); and
a plurality of ball sockets arranged in a corresponding matrix pattern on the PCB, each ball socket comprising a base having a circular edge and an outer side that engages the PCB and an opposing inner side configured for seating a conductive ball, and including a plurality of prongs secured to and extending from the inner side of the base and configured to receive and hold the conductive ball into contact with the inner side of the base and a rim formed on the circular edge and configured to form an indentation on the base that seats a conductive ball on the inner side and wherein the rim engages a surface of the PCB or IC package and said rim and indentation provide a solder fillet to aid in wicking solder and compensate for board warpage.

11. The ball socket and BGA connection system according to claim 10, wherein each prong of a ball socket comprises a ball engaging section configured in a substantially spherical arc and sized to engage a maximum surface area of the conductive ball.

12. The BGA connection system according to claim 10, wherein each ball socket comprises a microelectroformed member.

13. The BGA connection system according to claim 10, wherein each conductive ball comprises a solder ball.

14. The BGA connection system according to claim 10, wherein each prong includes an end having an outwardly extending tab that aids in guiding a conductive ball downward towards the base and into locking relationship with the ball socket.

15. The BGA connection system according to claim 10, wherein the prongs of each ball socket are a height greater than the width of the base to aid in imparting flexibility and accommodating thermal mismatch between the PCB and IC package.

16. The BGA connection system according to claim 10, wherein said prongs are formed as substantially rectangular leg members that extend outward from the base.

17. A ball socket used for connecting a ball of a ball grid array (BOA), comprising:
a base having a circular edge and an outer side configured for engaging a printed circuit board (PCB) or IC package and an opposing inner side configured for seating a conductive ball of a BGA; and a plurality of prongs secured to and extending from the inner side of the base and configured to receive and hold the conductive ball into contact with the inner side of the base and a rim formed on the circular edge and configured to form an indentation on the base that seats a conductive ball on the inner side and wherein the rim enages a surface of the PCB or IC package and said rim and indentation provides a solder fillet to aid in wicking solder and compensate for board warpage.

18. The ball socket according to claim 17, wherein each prong comprises a ball engaging section configured in a substantially spherical arc and sized to engage a maximum surface area of the conductive ball.

19. The ball socket according to claim 17, wherein each prong includes an end having an outwardly extending tab that aids in guiding a conductive ball downward towards the base and into locking relationship with the ball socket.

20. The ball socket according to claim 17, wherein said prongs of each ball socket are a height greater than the width of the base to aid in imparting flexibility and accommodating thermal mismatch between the PCB and IC package.

21. The ball socket according to claim 17, wherein said prongs are formed as substantially rectangular leg members that extend outward from the base.

* * * * *